United States Patent
Fleischer et al.

(10) Patent No.: US 9,575,756 B2
(45) Date of Patent: *Feb. 21, 2017

(54) PREDICATION IN A VECTOR PROCESSOR

(75) Inventors: Bruce M. Fleischer, Bedford Hills, NY (US); Thomas W. Fox, Hopewell Junction, NY (US); Hans M. Jacobson, White Plains, NY (US); Ravi Nair, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 850 days.

This patent is subject to a terminal disclaimer.

(21) Appl. No.: 13/569,349

(22) Filed: Aug. 8, 2012

(65) Prior Publication Data
US 2014/0040597 A1    Feb. 6, 2014

Related U.S. Application Data

(63) Continuation of application No. 13/566,129, filed on Aug. 3, 2012.

(51) Int. Cl.
   *G06F 9/30*          (2006.01)
   *G06F 9/38*          (2006.01)
   *G06F 15/80*        (2006.01)
   *G11C 7/10*         (2006.01)
   *G11C 8/12*         (2006.01)

(52) U.S. Cl.
CPC ...... *G06F 9/30036* (2013.01); *G06F 9/30018* (2013.01); *G06F 9/3879* (2013.01); *G06F 9/3887* (2013.01); *G06F 15/8084* (2013.01); *G11C 7/1006* (2013.01); *G11C 8/12* (2013.01)

(58) Field of Classification Search
CPC .................................................. G06F 9/30036
USPC ............................................................ 712/7
See application file for complete search history.

(56) References Cited

U.S. PATENT DOCUMENTS

| | | |
|---|---|---|
| 3,287,703 A | 11/1966 | Slotnick |
| 4,980,817 A | 12/1990 | Fossum et al. |
| 5,063,497 A | 11/1991 | Cutler et al. |
| 5,115,393 A | 5/1992 | Kashiyama et al. |
| 5,163,139 A | 11/1992 | Haigh et al. |

(Continued)

OTHER PUBLICATIONS

"Cell Architecture Explained Version 2," retrieved from http://www.blachford.info/computer/Cell/Cell0_v2.html on Jul. 23, 2012; pp. 1-3.

(Continued)

*Primary Examiner* — Andrew Caldwell
*Assistant Examiner* — Michael Metzger
(74) *Attorney, Agent, or Firm* — Cantor Colburn LLP

(57) ABSTRACT

Embodiments relate to vector processor predication in an active memory device. An aspect includes a system for vector processor predication in an active memory device. The system includes memory in the active memory device and a processing element in the active memory device. The processing element is configured to perform a method including decoding an instruction with a plurality of sub-instructions to execute in parallel. One or more mask bits are accessed from a vector mask register in the processing element. The one or more mask bits are applied by the processing element to predicate operation of a unit in the processing element associated with at least one of the sub-instructions.

13 Claims, 7 Drawing Sheets

(56) References Cited

U.S. PATENT DOCUMENTS

| | | | |
|---|---|---|---|
| 5,437,043 A | 7/1995 | Fujii et al. | |
| 5,544,337 A | 8/1996 | Beard et al. | |
| 5,568,380 A | 10/1996 | Brodnax et al. | |
| 5,784,706 A | 7/1998 | Oberlin et al. | |
| 5,832,290 A | 11/1998 | Gostin et al. | |
| 5,903,769 A | 5/1999 | Arya | |
| 5,922,066 A | 7/1999 | Cho et al. | |
| 5,987,600 A | 11/1999 | Papworth et al. | |
| 6,078,969 A | 6/2000 | Ichimura et al. | |
| 6,079,008 A | 6/2000 | Clery, III | |
| 6,085,315 A | 7/2000 | Fleck et al. | |
| 6,173,366 B1 | 1/2001 | Thayer et al. | |
| 6,253,287 B1 | 6/2001 | Green | |
| 6,317,819 B1 | 11/2001 | Morton | |
| 6,332,186 B1 | 12/2001 | Elwood et al. | |
| 6,366,999 B1* | 4/2002 | Drabenstott | G06F 9/30036 712/11 |
| 6,539,467 B1 | 3/2003 | Anderson et al. | |
| 6,785,842 B2 | 8/2004 | Zumkehr et al. | |
| 6,839,828 B2 | 1/2005 | Gschwind et al. | |
| 6,889,307 B1 | 5/2005 | Scheuerlein | |
| 6,950,923 B2 | 9/2005 | O'Connor et al. | |
| 7,196,708 B2 | 3/2007 | Dorojevets et al. | |
| 7,243,262 B2 | 7/2007 | Mukherjee et al. | |
| 7,277,988 B2 | 10/2007 | Gower et al. | |
| 7,302,532 B2* | 11/2007 | Sandorfi | G06F 13/1673 710/305 |
| 7,308,607 B2 | 12/2007 | Reinhardt et al. | |
| 7,467,288 B2 | 12/2008 | Glossner, III et al. | |
| 7,493,516 B2 | 2/2009 | Ferren et al. | |
| 7,584,336 B2 | 9/2009 | Tremaine | |
| 7,594,055 B2 | 9/2009 | Gower et al. | |
| 7,783,860 B2 | 8/2010 | Luick et al. | |
| 7,793,084 B1* | 9/2010 | Mimar | G06F 9/30021 712/236 |
| 7,877,582 B2 | 1/2011 | Gschwind et al. | |
| 7,908,460 B2 | 3/2011 | Liao et al. | |
| 7,949,853 B2 | 5/2011 | Sandon et al. | |
| 8,108,652 B1 | 1/2012 | Hui | |
| 8,255,745 B2 | 8/2012 | Ferren et al. | |
| 8,489,919 B2 | 7/2013 | Clark et al. | |
| 8,688,962 B2 | 4/2014 | Raikin et al. | |
| 2004/0193840 A1 | 9/2004 | Kirsch | |
| 2005/0055543 A1 | 3/2005 | Moyer | |
| 2006/0143509 A1 | 6/2006 | Okawa | |
| 2007/0050661 A1 | 3/2007 | Ferren et al. | |
| 2008/0005479 A1 | 1/2008 | Tremaine | |
| 2008/0059758 A1 | 3/2008 | Sachs | |
| 2008/0222444 A1 | 9/2008 | Olofsson et al. | |
| 2009/0106526 A1 | 4/2009 | Luick et al. | |
| 2009/0172348 A1 | 7/2009 | Cavin | |
| 2009/0172364 A1 | 7/2009 | Sprangle et al. | |
| 2010/0036994 A1* | 2/2010 | Resnick | G06F 13/287 710/316 |
| 2010/0049951 A1* | 2/2010 | Gonion et al. | 712/222 |
| 2010/0122069 A1 | 5/2010 | Gonion | |
| 2010/0268987 A1 | 10/2010 | Clark et al. | |
| 2010/0332764 A1 | 12/2010 | Jouppi | |
| 2011/0145543 A1 | 6/2011 | Damron | |
| 2011/0153983 A1 | 6/2011 | Hughes et al. | |
| 2011/0161642 A1 | 6/2011 | Eichenberger et al. | |
| 2011/0246828 A1 | 10/2011 | Monchiero et al. | |
| 2011/0264858 A1 | 10/2011 | Jeddeloh et al. | |
| 2012/0047398 A1 | 2/2012 | Vera et al. | |
| 2012/0060015 A1 | 3/2012 | Eichenberger et al. | |
| 2012/0124251 A1* | 5/2012 | Hnatko et al. | 710/29 |
| 2012/0144089 A1 | 6/2012 | Hall et al. | |
| 2012/0233507 A1 | 9/2012 | Gonion | |
| 2012/0254591 A1 | 10/2012 | Hughes et al. | |
| 2014/0201498 A1 | 7/2014 | Ould-Ahmed-Vall et al. | |

OTHER PUBLICATIONS

A. Fawibe, et al., "New Memory Organizations for 3D DRAM and PCMs," Archictecture of Computing Systems, ARCS 2012—25th International Conference, Proceedings Publication Date: Feb. 29, 2012; pp. 1-12.

H. P. Hofstee, et al., "Power Efficient Processor Architecture and the Cell Processor," IEEE Computer Society 2005; Proceedings of the 11th Int'l Symposium on High-Performance Computer Architecture; pp. 1-5.

IBM, "Logic on DIMM," ip.com; ip.com number: IPCOM000191776D; Jan. 14, 2010; pp. 1-4.

Wikipedia, "Cell (microprocessor)," retrieved from http://en.wikipedia.org/wiki/Cell_%microprocessor%29 on Jul. 23, 2012; pp. 1-17.

David A Patterson, Lecture 6: Vector Processing, 1998, 60 pgs, retrieved from the internet on May 7, 2015, retrieved from URL <http://www.cs.berkeley.ed/~pattrsn/252S98/Lec06-vector.pdf>.

David Patterson and John Hennessy, Computer Architecture A Quantitative Approach, 1996, Morgan Kauffman, Second Edition, 4 pages.

Ergin et al, Register Packing: Exploiting Narrow-width operands for reducing register file pressure, IEEE, 1072-4451/04, 12 pqs, retrieved from the internet on May 7, 2015, retrieved from URL <http://ieeexplore.ieee.org./stamp/stamp.jsp?tp&tarnumbr=155100>.

\* cited by examiner

PREDICATION IN A VECTOR PROCESSOR

CROSS-REFERENCE TO RELATED APPLICATIONS

This is a continuation application that claims the benefit of U.S. patent application Ser. No. 13/566,129 filed Aug. 3, 2012, the contents of which are incorporated by reference herein in their entirety.

BACKGROUND

The present invention relates generally to computer memory, and more particularly to predication in a vector processor.

Computer systems often require a considerable amount of high speed memory, such as random access memory (RAM), to hold information, such as data and programs, when a computer is powered and operational. Memory system demands have continued to grow as computer systems have increased performance and complexity.

Communication from a main processor to locations on memory devices can involve relatively long data access times and latency. The time it takes for the main processor to access memory can be, for example, several hundred cycles, including time to realize the data is not in cache (for memory reads), time to traverse from a processor core of the main processor to I/O, across a module or other packaging, arbitration time to establish a channel to memory in a multi-processor/shared memory system, and time to get the data into or out of a memory cell.

A vector processor may support multiple memory accesses in parallel. Supporting parallel memory accesses to multiple memory locations can increase bandwidth but also increases power consumption. The increased bandwidth may come at a cost of reduced efficiency, particularly where data accessed at one or more of the memory locations is not used in further processing.

SUMMARY

Exemplary embodiments include a system for vector processor predication in an active memory device. The system includes memory in the active memory device and a processing element in the active memory device. The processing element is configured to perform a method including decoding an instruction with a plurality of sub-instructions to execute in parallel. One or more mask bits are accessed from a vector mask register in the processing element. The one or more mask bits are applied by the processing element to predicate operation of a unit in the processing element associated with at least one of the sub-instructions.

Additional exemplary embodiments include a system for vector processor predication in an active memory device. The system includes memory in the active memory device and a processing element in the active memory device. The processing element is configured to perform a method including fetching an instruction from an instruction buffer in the processing element. The instruction, including a plurality of sub-instructions to execute in parallel, is decoded. One or more mask bits are accessed from a vector mask register in the processing element. The one or more mask bits are applied by the processing element to predicate operation of a unit in the processing element associated with at least one of the sub-instructions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features and advantages of the invention are apparent from the following detailed description taken in conjunction with the accompanying drawings in which:

DETAILED DESCRIPTION

Figure 1:
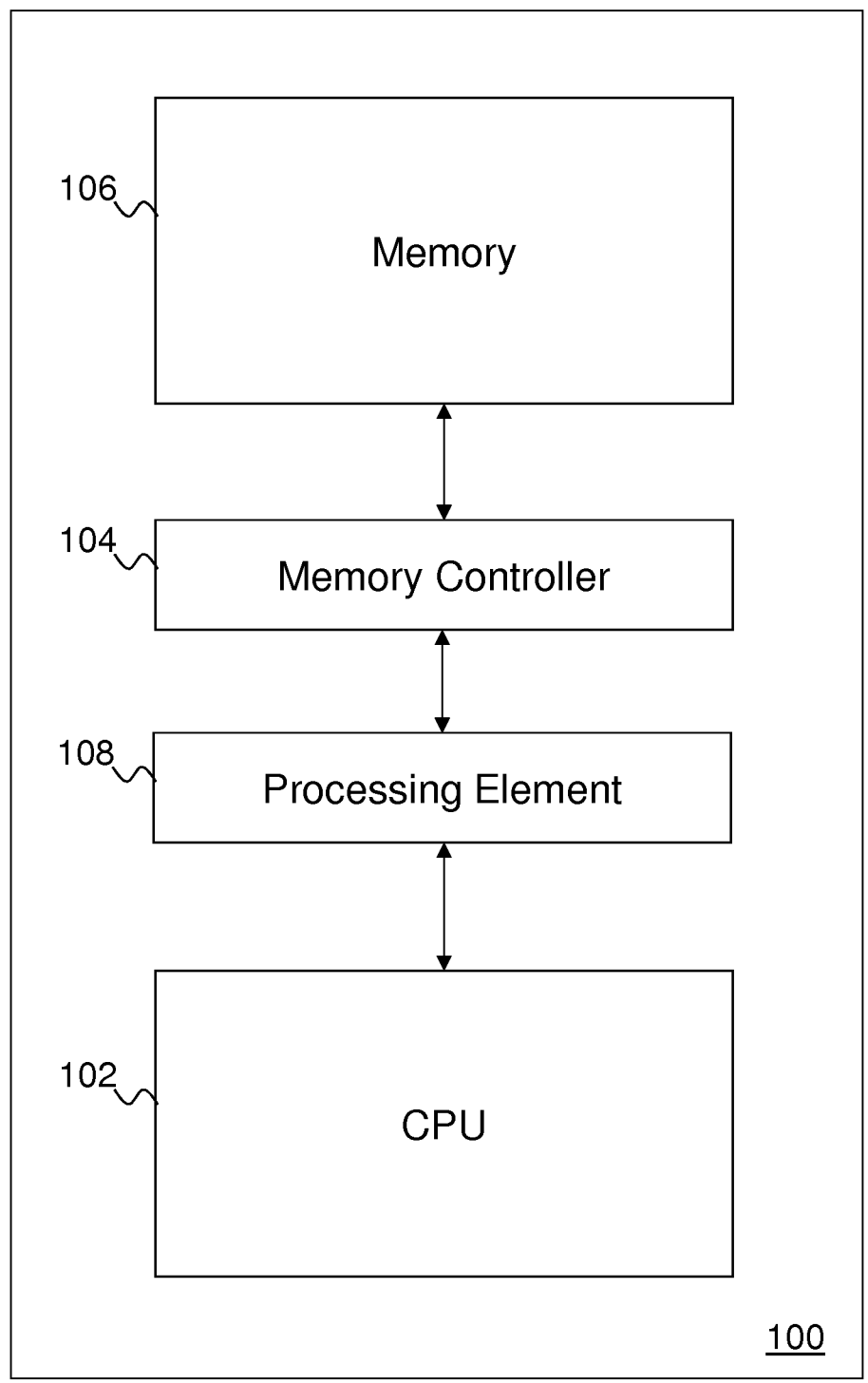
FIG. 1 illustrates a block diagram of a system for active memory in accordance with an embodiment.

An embodiment is directed to predication in a vector processor in an active memory device. The active memory device may be any suitable memory device including a plurality of memory elements (e.g., chips) connected to a logic portion and a processing element. In an embodiment, the active memory device includes layers of memory that form a three dimensional ("3D") memory device (e.g., a memory cube) where individual columns of chips form vaults in communication with the processing element and logic. The active memory device may include a plurality of processing elements configured to communicate to the chips and other processing elements. In an embodiment, a processing element accesses a selected address in a vault through an interconnect network. In addition, the interconnect network provides a communication path between processing elements on the active memory device as well as between processing elements and a main processor. Each vault may have an associated memory controller or logic unit that is also coupled to the interconnect network.

In embodiments, processing elements are implemented as vector processors. In a vector processor, memory accesses and arithmetic instructions can act upon full vectors or generally continuous portions of vectors, where vectors enable parallel processing on multiple data elements. For some operations, memory accesses or calculations for randomly distributed elements of the vectors may be immaterial. To reduce traffic through a memory hierarchy, and the associated energy consumed, by unnecessary memory accesses, the vector processors include vector mask register files for use in predication of instructions and as targets of comparison instructions. Predication of instructions allows for selective execution of certain elements of the vectors based on a mask. The vector processors also provide support for vector mask generation, logical operations on vector masks, and automatic reduction of vector mask registers to summary condition bits. The vector mask bits can be automatically reduced to a single condition bit as a summary of generated mask bits during comparisons, for use during future conditional branch instructions. Instructions within the vector processor architecture are capable of being predicated. Memory access instructions, in particular, are useful, when predicated, for reducing unnecessary traffic through the memory hierarchy, and for conserving energy during such situations. Use of predication during arithmetic operations can also eliminate the need for permuting of data, by providing for "on-the-fly" construction of a vector which contains only desired, piece-meal components from various operations.

Embodiments include an active memory device that can perform a complex set of operations using multiple locations (e.g., data stored at specific addresses) within the active memory device as operands. Further, a process is provided whereby the instructions and operations are performed autonomously on these operands within the active memory device. Specifically, the instructions are stored within the active memory device itself and are not executed by a main processor. The stored instructions are provided to the processing elements for processing by the processing element in the active memory device. In one embodiment, the processing elements are programmable engines, including an instruction buffer, an instruction unit with branching capability and instruction decode, a mixture of vector, scalar, and mask register files, a plurality of load/store units for the movement of data between memory and the register files, and a plurality of execution units for the arithmetic and logical processing of various data types. Also included in the active memory device are address translation capabilities for converting virtual addresses to physical addresses, a unified Load/Store Queue to sequence data movement between the memory and the processing elements, and a processor communications unit, for communication with the main processor.

In an embodiment, the active memory device is configured to load configuration information or instructions from a part of the active memory device into a processing element following receiving a command from an external requestor, such as a main processor or another processing element. In addition, the processing element may perform virtual-to-real address translations that are computed while executing the loaded instructions. In an example, when performing a load instruction, the active memory device accesses an operand from a memory location and places the operand in a register in the processing element. A virtual address of the memory location is generated by the load instruction and is translated into a real address by the processing element. Similarly, when performing a store instruction, the active memory device writes a memory location with the contents (e.g., an operand) in a register in the processing element. A virtual address of the memory location is generated by the store instruction and is translated into a real address by the processing element.

Embodiments of the processing element in the active memory device also have the ability to read or to write operands in any part of the active memory device through the interconnect network. Specifically, a processing element may access other vaults in the active memory device using the interconnect network. In an embodiment, processing elements are pooled and coupled to the vaults via the interconnect network, where the processing elements are not physically located in the vault stack. In an embodiment, the interconnect network is a coupling device, such as a crossbar switch, configured to connect any processing element to any memory vault, provided the processing element and memory vault are coupled to the interconnect. In an embodiment, the interconnect network may couple a plurality of active memory devices, where the interconnect network provides a communication path between processing elements and memory vaults of separate devices.

In one embodiment, the processing element is included with the memory controller as part of the stack. In addition, the processing element may perform complex arithmetic and logic operations on the operands, and read and write end results back to locations in memory. The active memory device may return a single result value or signal to the main processor indicating that the results of the desired complex operation are ready in the active memory device, thus performing the high bandwidth processing on the active memory device and using a lower bandwidth communication between the active memory device and main processor.

The processing capabilities within an active memory device may reduce memory latency and energy consumption that would otherwise be experienced when memory is accessed by a processor residing in a separate chip. Instead of bringing data from memory to the separate processing chip through lower bandwidth communication paths, performing what is often quite simple calculations on the data, and then transferring the processed data back to memory, the main processor can configure the processing elements within the active memory device, and then instruct them to carry out the data processing tasks. This may be achieved by sending one or more commands from the main processor to the active memory device. In this scenario, the movement of data between the location where the data processing is performed and memory is greatly reduced, both in the distance it has to travel from the memory to the data processing location, and in the number of levels of cache traversed through a memory hierarchy.

FIG. 1 illustrates a block diagram of a system for storing and retrieving data in a memory in accordance with an embodiment. A system 100 depicted in FIG. 1 includes a computer processor (CPU) 102, a memory 106 having memory devices, as well as a memory controller 104 and processing element 108 for receiving and processing data from the computer processor 102 to be stored in the memory 106.

The memory controller 104 may be in communication with the computer processor 102 and receive write requests from the computer processor 102 without using functions of the processing element 108. The write requests contain data to be written to the memory 106 and a real address for identifying the location in the memory 106 to which the data will be written. The memory controller 104 stores data at a real address within the memory 106. The computer processor 102 can map the virtual address to a real address in the memory 106 when storing or retrieving data. The real address for a given virtual address may change each time data in the memory 106 is modified.

In an embodiment, the processing element 108 is in communication with the computer processor 102 and receives a command from the computer processor 102. The command may correspond to instructions stored in the memory 106 to perform write requests for data to be written to the memory 106. The command may also include a virtual address for identifying the location in the memory 106 to which the data will be written. The memory controller 104 and/or processing element 108 stores data at a real address within the memory 106. In an embodiment, the processing element 108 maps the virtual address to a real address in the memory 106 when storing or retrieving data. As described in further detail below, the computer processor 102 provides commands to the memory 106, where the processing element 108 receives the command and fetches corresponding instructions from the memory 106. The system 100 is one example of a configuration that may be utilized to perform the processing described herein. Although the system 100 has been depicted with only a single memory 106, memory controller 104, processing element 108 and computer processor 102, it will be understood that other embodiments would also operate in other systems with two or more of the memory 106, memory controller 104, processing element 108 or computer processor 102. In an embodiment, the memory 106, memory controller 104, processing element 108 and computer processor 102 are not located within the same computer. For example, the memory 106, processing element 108 and memory controller 104 may be located in one physical location (e.g., on a memory module) while the computer processor 102 is located in another physical location (e.g., the computer processor 102 accesses the memory controller 104 and/or processing element 108 via a network). In addition, portions of the processing described herein may span one or more of the memory 106, memory controller 104, processing element 108 and computer processor 102.

Figure 2:
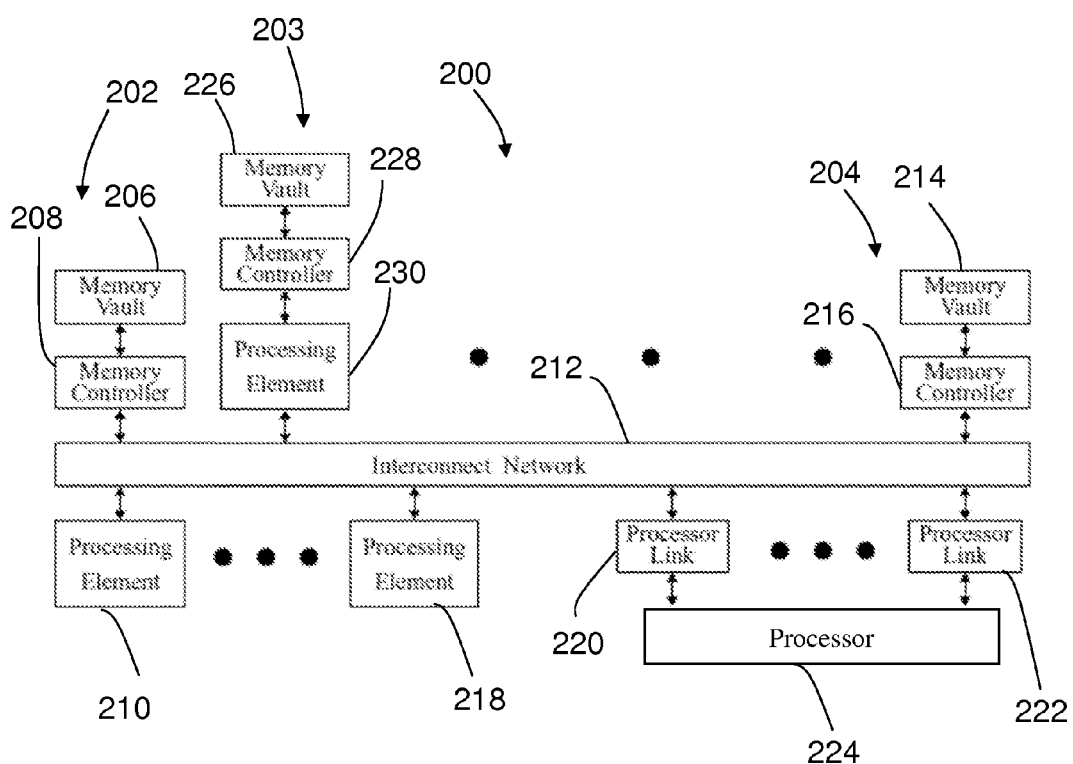
FIG. 2 illustrates a block diagram of a memory system with active memory in accordance with an embodiment.

FIG. 2 is a schematic diagram of an embodiment of a computer system 200 implementing active memory. In one embodiment, the computer system 200 includes an active memory device 202, an active memory device 203 and an active memory device 204. The active memory device 202 includes a memory vault 206, a memory controller 208 and a processing element 210. In an embodiment, the processing element 210, memory vault 206 and memory controller 208 are coupled and communicate via an interconnect network 212. Specifically, the processing element 210 communicates to the memory vault 206, memory controller 208 and other memory devices, such as active memory devices 203 and 204, via the interconnect network 212. The interconnect network 212 is also coupled to a main processor 224 by processor links 220 and 222. The interconnect network 212 provides a fast and high bandwidth path for communication between portions of the device, such processing elements, memory controllers and memory, to provide improved performance and reduced latency for the active memory.

The active memory device 203 includes a memory vault 226, a memory controller 228 and a processing element 230. In an embodiment, the processing element 230, memory vault 226 and memory controller 228 are all located on the same side of the interconnect network 212, such as within a single stack. By positioning the processing element 230 in the same stack as memory vault 226, the latency is reduced when accessing locations in the memory vault 226, thus further improving performance. In one embodiment, the active memory 204 includes a memory vault 214 and memory controller 216 coupled to processing element 210 and processing element 218 via the interconnect network 212. As depicted, the processing element 218 is located on the other side of the interconnect network 212 from the memory controller 216 and memory vault 214. In embodiments, the active memory devices 202, 203 and 204 include multiple layers of stacked addressable memory elements. Further, the stacks memory may be divided into memory vaults 206, 226 and 214, or three-dimensional blocked regions of the memory device which share a common memory controller and/or memory element, and are capable of servicing memory access requests to their domain of memory independently of one another.

In embodiments, the processing elements, memory vaults and memory controllers may be arranged in a suitable manner depending on the application. For example, one or more processing elements, such as processing element 218, may be positioned on one side of the interconnect network 212 and may operate as a pool of processing elements that are available for accessing any memory in the memory system coupled to the interconnect network 212. The pooled processing elements are not limited to accessing a particular memory vault and, thus, one or more elements may be utilized upon receiving a command from the main processor 224. Accordingly, processing element 218 may be configured to access each memory vault 206, 226 and 214. In another embodiment, one or more processing element, such as processing element 230, is located as part of a stack including a memory vault 226 and memory controller 228. In such a configuration, the processing element 230 is configured to access memory vault 226 coupled to the interconnect network 212, including memory vaults 206 and 214. In one embodiment, one or more processing element, such as processing element 210, is positioned on an opposite side of the interconnect network 212 from the memory vault 206 and memory controller 208. In the configuration, the processing element 210 is configured to access any memory coupled to the interconnect network 212, including memory vaults 226 and 214.

In an embodiment, the computer system may include a plurality of active memory devices, such as the active memory devices 202, 203 and 204. Further, each active memory device may include a plurality of stacks, each stack including a memory vault, memory controller and associated processing element. In one example, the number of processing elements may be greater than the number of memory vaults. In another embodiment, the memory devices may include fewer processing elements than memory vaults. In embodiments, the processing elements are pooled and available to access any memory in the system. For example, a memory device may include 16 memory vaults and memory controllers, but only eight processing elements. The eight processing elements are pooled, and utilized as resources for accessing any memory vaults coupled to the interconnect network. In another example, a memory device may be passive, where the device is controlled by processing elements of active memory devices coupled to the interconnect network.

Figure 3:
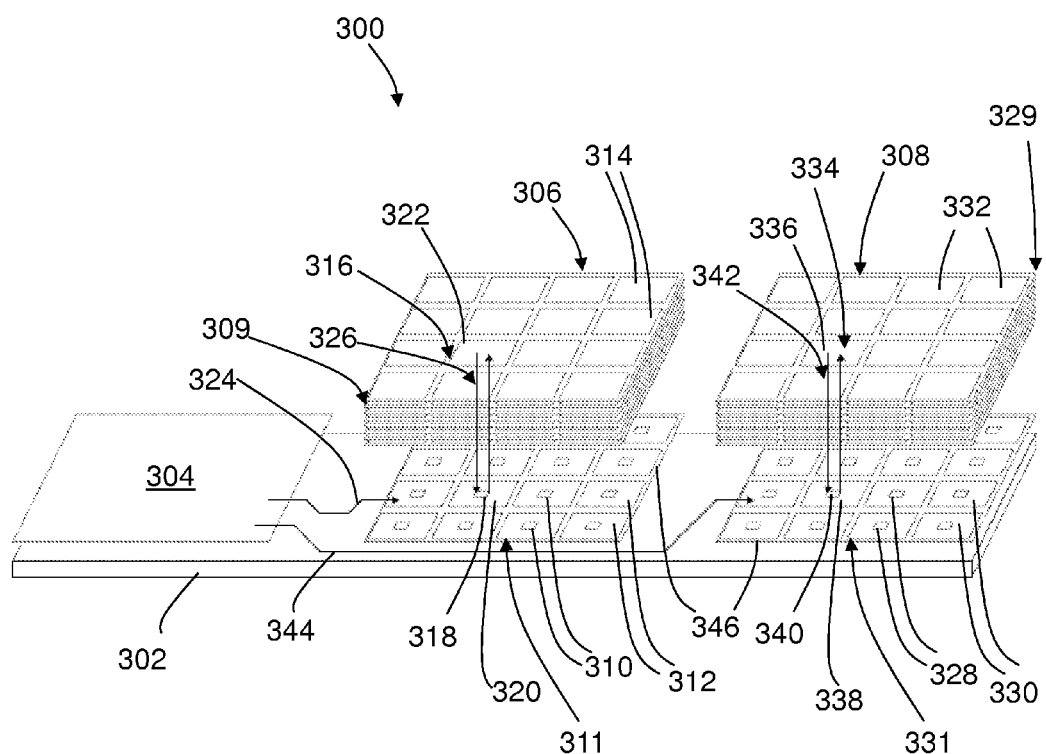
FIG. 3 illustrates a schematic diagram of a memory system with active memory in accordance with an embodiment.

FIG. 3 is a diagram of an exemplary computer system 300 implementing active memory. The computer system 300 includes a circuit board 302, a main processor 304, active memory device 306 and active memory device 308. The active memory device 306, active memory device 308 and main processor 304 are disposed on the circuit board 302. As depicted, portions of the active memory devices 306 and 308 are exploded to show details of the computer system 300 arrangement. The active memory devices 306 and 308 communicate to the main processor 304 via signal paths 324 and 344, respectively. As depicted, the active memory 306 device is arranged in layers, where a base layer 311 includes a plurality of memory controllers 310 and processing elements 312. For example, the active memory device 306 includes layers 309 of memory placed on top of the base layer 311, where the layers 309 each have a plurality of memory elements. As depicted, the base layer 311 also includes an interconnect network 346 to enable high bandwidth communication between memory, memory controllers and processing elements in the device.

In an embodiment, the active memory device 306 includes a plurality of memory vaults 314, where each memory vault 314 includes a memory element from each layer 309, the memory vaults 314 positioned adjacent to memory controllers 310 and processing elements 312. Specifically, the exemplary active memory device 306 includes layers of 16 memory elements, where the element layers form stacks, including a stack 316, where the stack 316 includes a memory vault 322 disposed above a memory controller 318 and a processing element 320. A high bandwidth communication path 326 provides a high bandwidth, direct and substantially reduced length (e.g., as compared to paths 324, 344) communication path between the processing element 320 and memory locations within the memory vault 322, thus reducing latency and power consumption for memory accesses. For example, the processing element 320 may receive a command from the main processor 304, load instructions from within the active memory device 306 based on the command, and, as part of the loaded instructions, access data at a location in the memory vault 314 and perform a complex operation on the data in the processing element 320. Further, the processing element 320 may also store data, such as the result, in the memory vault 314 and transmit a value or signal to the main processor 304 following execution of the command. In an embodiment, the processing element 320 stores or writes data (e.g. an operand) from a register in the processing element 320 to the memory vault 314. The processing element 320 is also configured to translate addresses from virtual-to-real and real-to-virtual as part of the read or store operations. Thus, the processing element 320 provides instruction loading, address translation, complex operations and other tasks local to the memory to reduce latency, save power and free up the main processor 304 to perform other tasks.

Similarly, the active memory device 308 includes a plurality of memory controllers 328 and processing elements 330 disposed on a base layer 331. In an embodiment, the active memory 308 includes layers 329 of memory devices placed on top of the base layer 331, where the layers 329 each have a plurality of memory devices. The base layer 331 also includes an interconnect network 346 to enable high bandwidth communication between memory and processing elements in the device. In an embodiment, the interconnect networks 346 of active memory device 306 and active memory device 308 are coupled and allow communication between processing elements and memory on separate devices.

In an embodiment, the active memory device 308 includes a plurality of memory vaults 332, where each memory vault 332 includes a memory element from each layer 329, the memory vaults 332 are positioned adjacent to memory controllers 328 and processing elements 330. The exemplary active memory device 308 includes 16 stacks, including stack 334, where the stack 334 includes a memory vault 336 disposed above a memory controller 340 and a processing element 338. A high bandwidth communication path 342 provides communication between the processing element 330 and memory locations within the memory vault 336.

Figure 4:
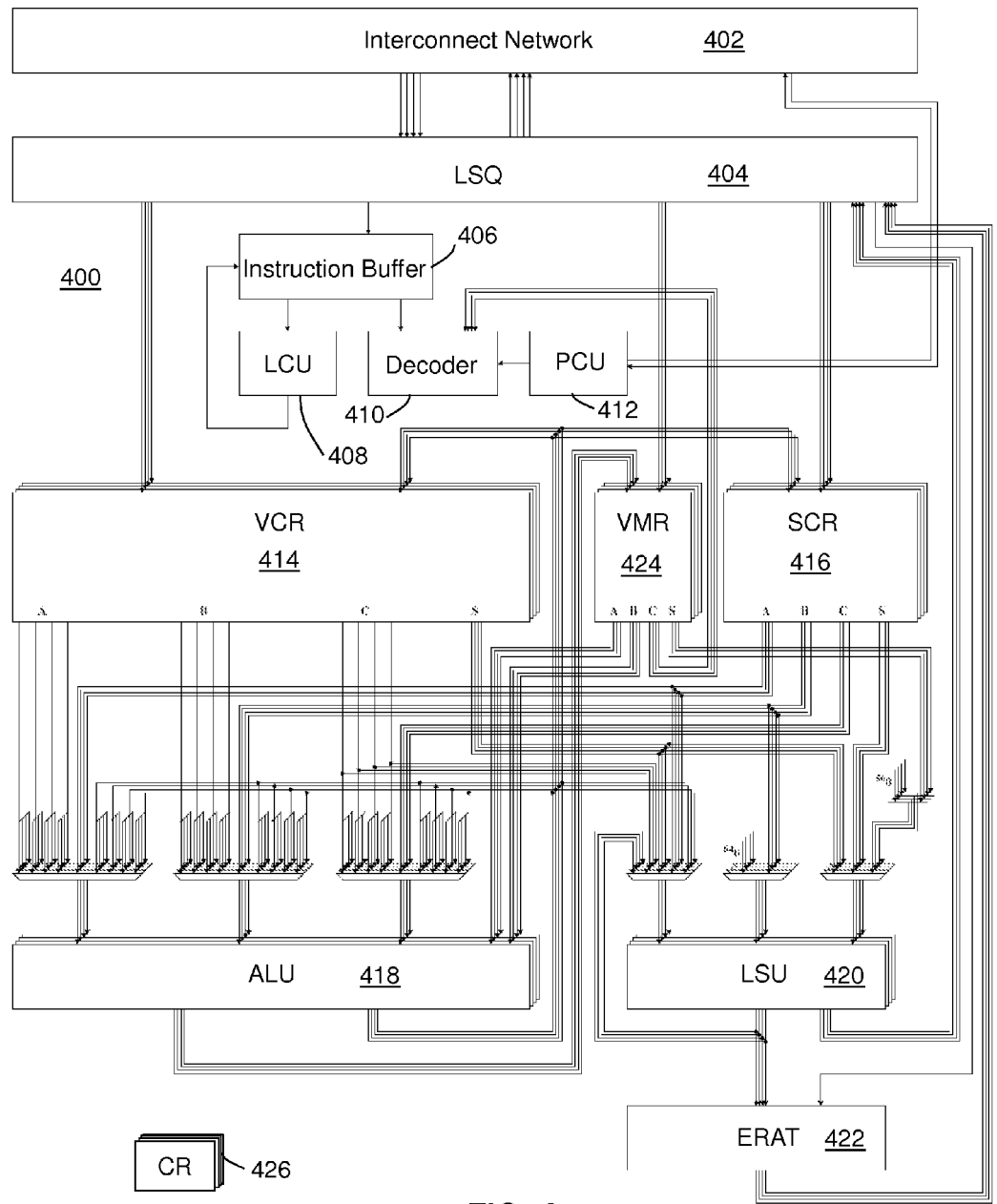
FIG. 4 illustrates a block diagram of a processing element for vector processing in an active memory device in accordance with an embodiment.

FIG. 4 depicts an example of a processing element 400 coupled to an interconnect network 402 as an embodiment of one of the processing elements of FIGS. 1-3. The processing element 400 is a vector processor, situated in an active memory device, such as one of the active memory devices of FIGS. 1-3. In the example of FIG. 4, the processing element 400 includes a load-store queue (LSQ) 404 coupled to the interconnect network 402 and to an instruction buffer 406. The instruction buffer 406 is also coupled to a lane control unit (LCU) 408 and a decoder 410. A processor communication unit (PCU) 412 provides a communication interface between the processing element 400 and the main processor or other processing elements through the interconnect network 402. The LSQ 404 is also coupled to a vector computation register file (VCR) 414, a scalar computation register file (SCR) 416, and a vector mask register file (VMR) 424. The VCR 414 and SCR 416 are coupled through multiple multiplexers to an arithmetic logic unit (ALU) 418 and a memory-access unit 420, also referred to as a load-store unit (LSU) 420. The ALU 418 is coupled to itself and to the LSU 420 through multiplexers, and is also coupled to the VCR 414 and the SCR 416. The LSU 420 may also be coupled to itself, to the LSQ 404, to an effective-to-real address translation unit (ERAT) 422, to the VCR 414 and to the SCR 416 (all connections not depicted). The ERAT 422 is also coupled to the LSQ 404. The VMR 424 is coupled to the LSQ 404, an output of the ALU 418, and to inputs of the ALU 418 and LSU 420 through multiplexers. As will be appreciated, numerous other connections and elements can be included in the processing element 400. For example, connections between the decoder 410 and other elements are not depicted for clarity. Additionally, depicted connections in FIG. 4 can be modified or omitted, such as the depicted connection between decoder 410 and PCU 412.

The processing element 400 supports an instruction set architecture including a broad range of arithmetic capabilities on many data types. Vector processing capabilities of the processing element 400 allows for single instruction, multiple data (SIMD) in time, while SIMD in a spatial dimension is also supported. The instruction buffer 406 holds instructions (also referred to as "lane instructions"), which are fetched and executed in order subject to branching. In an embodiment, each lane instruction contains 9 sub-instructions for execution in various units within the processing element 400. An iteration count may be included within the lane instruction, allowing the sub-instructions to be repeated up to a predetermined number of times (e.g., up to 32 times). This facilitates SIMD in time. The LCU 408 can manage the iteration count and determine when to advance to a next instruction or repeat execution of the same instruction. In an embodiment, arithmetic pipelines of ALU 418 are 64 bits wide, and spatial SIMD is supported by virtue of the ability to execute data types smaller than 64 bits in parallel, simultaneously as multiple execution slots. For example, assuming that a lane instruction includes 9 sub-instructions, execution of the sub-instructions can be performed in the LCU 408 for lane control, and in four processing slices, each of which includes an ALU 418 and an LSU 420. Pairs of the VCR 414 and the SCR 416 can be implemented per processing slice and are accessible by each pair of the ALU 418 and LSU 420. Each processing slice may also include a VMR 424 and a condition register (CR) 426. Accordingly, the VCR 414, SCR 416, ALU 418, LSU 420, VMR 424, CR 426 and associated multiplexers are depicted as stacks of four elements to indicate 4 processing slices in the example of FIG. 4.

At the processing slice level, computation can occur on floating-point and fixed-point data types at, for example, a 64-bit granularity in a temporal SIMD manner on 64-bit vector elements, and in a temporal and spatial SIMD manner on narrower vector sub-elements, which can be 32-bits, 16-bits, or 8-bits wide.

Each processing slice within the processing element 400 includes a memory access pipeline (load/store pipeline) and an arithmetic pipeline. Managing flow through the LSU 420 as a load/store pipeline can enable computation of one address per vector data element or sub-element. The processing element 400 provides the ability to perform associated fixed-point effective address (i.e., virtual address) computations. The arithmetic pipeline through the ALU 418 can include a robust assortment of floating-point and fixed-point operations to support a variety of workloads.

The LSU 420 may support load and store operations of, for example, 8, 4, 2 and 1 byte(s) and load and store operations of 4, 2, and 1 byte(s) to and from registers with packed data.

The ALU 418 may support copy operations between register files, arithmetic, rounding and conversion, comparison, and maximum and minimum operations on floating-point data types of double-precision (64 bits) and single-precision (32 bits), and arithmetic, rotate/shift, comparison, logical, count leading zeros, and ones population count operations on fixed-point data types of doubleword (64 bits), word (32 bits), halfword (16 bits) and bytes (8 bits).

In an embodiment, the computational model of a processing slice within the processing element 400 is a vector single instruction multiple data (SIMD) model with the VCR 414 and SCR 416. The VCR 414 can support multiple dimensions of registers, while the SCR 416 supports a single dimension of registers. For example, the VCR 414 can include 16 register entries with 32 elements each of 64 bits, and the SCR 416 can include 16 register entries with 1 element each of 64 bits, although numerous other configurations may be supported. The VMR 424 also has multiple dimensions of registers. For example, the VMR 424 can include 4 register entries with 32 elements each of 8 bits. SIMD instructions access multiple data in different cycles, and for data types smaller than one register element, also access multiple data in space in each cycle. When a SIMD instruction accesses a register entry of the VCR 414 or VMR 424, one element of each accessed entry is accessed per cycle. If a register entry of the VMR 424 is used as a predicate, one element of the register entry is associated with each cycle of the SIMD instruction's execution. A variable number of execution slots can be used, operating on an equal number of sub-elements, whereby the sub-elements taken together add up to one register element (either VCR 414 or SCR 416) of 64 bits in this example. The number of execution slots and the corresponding number of vector sub-elements depend upon the data type of the instruction. Examples of data types and sizes of various formats include: floating-point with double-precision (64-bit) and single-precision (32-bit) data types and fixed-point for a doubleword (64-bit), word (32-bit), halfword (16-bit), and byte (8-bit) data types.

The VMR 424 can be used to enable different functional behavior on different vector elements without conditional branches. For example, mask bits in the VMR 424 can be used in the LSU 420 to prevent issuing non-functional load/store requests and avoid unnecessary power consumption in the memory system. Mask bits of the VMR 424 can also be used to reduce and throttle power within processing pipelines of the processing element 400. For example, the mask bits of the VMR 424 can be used as early inputs to clock-gating logic for pipeline stages and register files, avoiding unnecessary clock and data power in the pipelines and register files of the ALU 418, LSU 420, VCR 414 and SCR 416. SIMD-in-space instructions have multiple vector sub-elements in each pipeline cycle and multiple mask bits per cycle. Control logic for these instructions can use the mask bits of the VMR 424 to clock- or data-gate different parts (e.g., different bytes) of the datapath and enable partial writes to the register files.

In exemplary embodiments, the processing element 400 includes ALU 418 and LSU 420 instructions that write to entries of the VMR 424. The processing element 400 may also include an instruction to load VMR 424 data from memory. The processing element 400 can include a compare instruction which writes results of each element comparison of a multi-element comparison to the VMR 424. The number of bits per VMR 424 element is the maximum number of SIMD-in-space comparisons which can occur per cycle. When a compare instruction using the maximum SIMD-in-space parallelism executes, there is a one-to-one correspondence between comparison results and VMR bits. When a compare instruction using less than the maximum SIMD-in-space parallelism executes, there is a one-to-N correspondence between comparison results and VMR bits, with N>1. A compare instruction writes a summary of all sub-element compares to the CR 426. The compare instruction syntax can include a bit that determines whether the summary is an OR-reduction or an AND-reduction. When a compare instruction is predicated, the mask operand controls which sub-element comparisons contribute to the summary.

The processing element 400 can also include a compare instruction with syntax that includes a bit to determine whether the current value of the CR 426 is included in the reduction to produce the new value in the CR 426, or not. The processing element 400 may include an instruction that computes a mask result as a logical function of one or more mask operands for the VMR 424. The processing element may include an instruction to move data from the VCR 414 or the SCR 416 to the VMR 424. The processing element 400 can also include an instruction that computes a mask result as a function of one or more numeric operands (e.g., put is only in the first N elements).

In an exemplary embodiment, the processing element 400 includes an LSU 420 instruction that stores VMR 424 data to memory. The processing element 400 can also include an ALU 418 instruction that moves data from the VMR 424 to the VCR 414 or the SCR 416. The processing element 400 may include an ALU 418 instruction with a VMR 424 operand that computes a numeric result (e.g., population count). During the execution of a predicated ALU 418 instruction that computes one element per cycle (not SIMD-in-space), when the mask bit for one element is 0, the corresponding element of the target vector register is not changed.

During the execution of a predicated ALU 418 instruction that computes more than one sub-element per cycle (SIMD-in-space), when the mask bit for one sub-element is 0, that sub-element of the result may be boundedly undefined.

Figure 5:
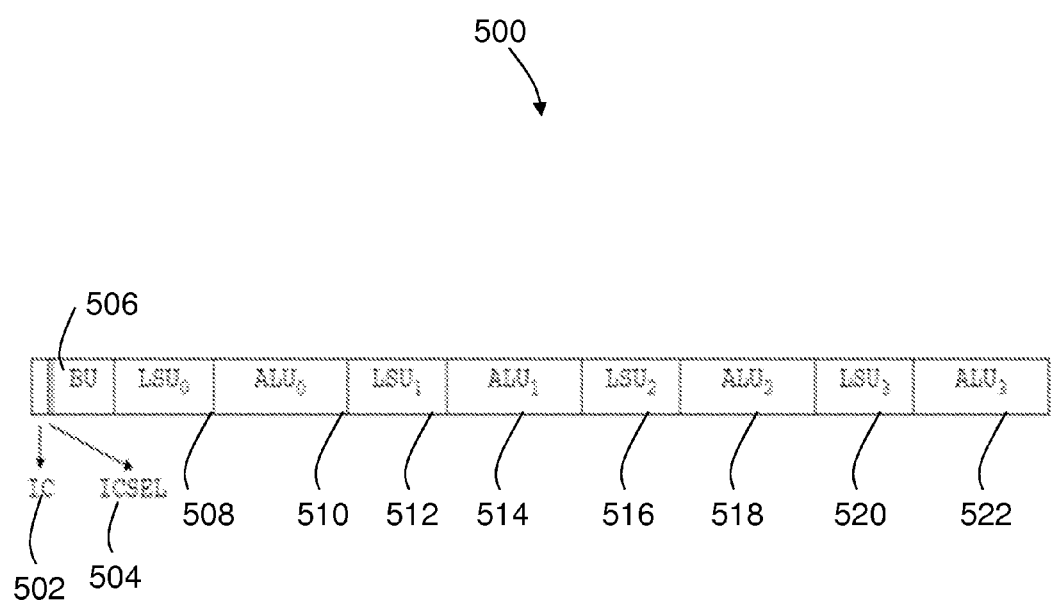
FIG. 5 illustrates an example of a lane instruction format for vector processing in an active memory device in accordance with an embodiment.

An example of a lane instruction format 500 is depicted in FIG. 5 as a processing element operation which utilizes and controls all of the resources within processing element 400 of FIG. 4. In the example of FIG. 5, the lane instruction format 500 includes a 5-bit iteration count (IC) field 502, a 1-bit iteration count select (ICS) field 504, and nine sub-instructions. The sub-instructions include a 19-bit branch (BU) sub-instruction 506, which executes once and controls the sequence of lane instruction execution, four 31-bit memory access or load-store (LSU) sub-instructions 508, 512, 516, 520 (one per processing slice 0-3), which execute one or more times per lane instruction, and four 41-bit arithmetic-logical (ALU) sub-instructions 510, 514, 518, 522 (one per processing slice 0-3), which execute one or more times per lane instruction. The IC field 502 within a lane instruction, or an iteration count register, as selected by the ICS field 504, determines the number of times that the ALU and LSU sub-instructions are repeated. The BU sub-instruction 506 may be referred to generally as a lane control (LCU) sub-instruction for the LCU 408 and can include other control operations, such as returning, pausing, and no-operation, in addition to branching.

Each sub-instruction is a processor operation which utilizes and controls all of the resources within a given unit within the processing element 400. If a sub-instruction contains all scalar registers in the SCR 416 for the target and source(s), then the sub-instruction can be executed during execution of a first element of the lane instruction. Lane control sub-instructions, including branch sub-instructions, can be executed during execution of the last element of the lane instruction. Conditions for branch sub-instructions may be evaluated during execution of the first element of the lane instruction.

Figure 6:
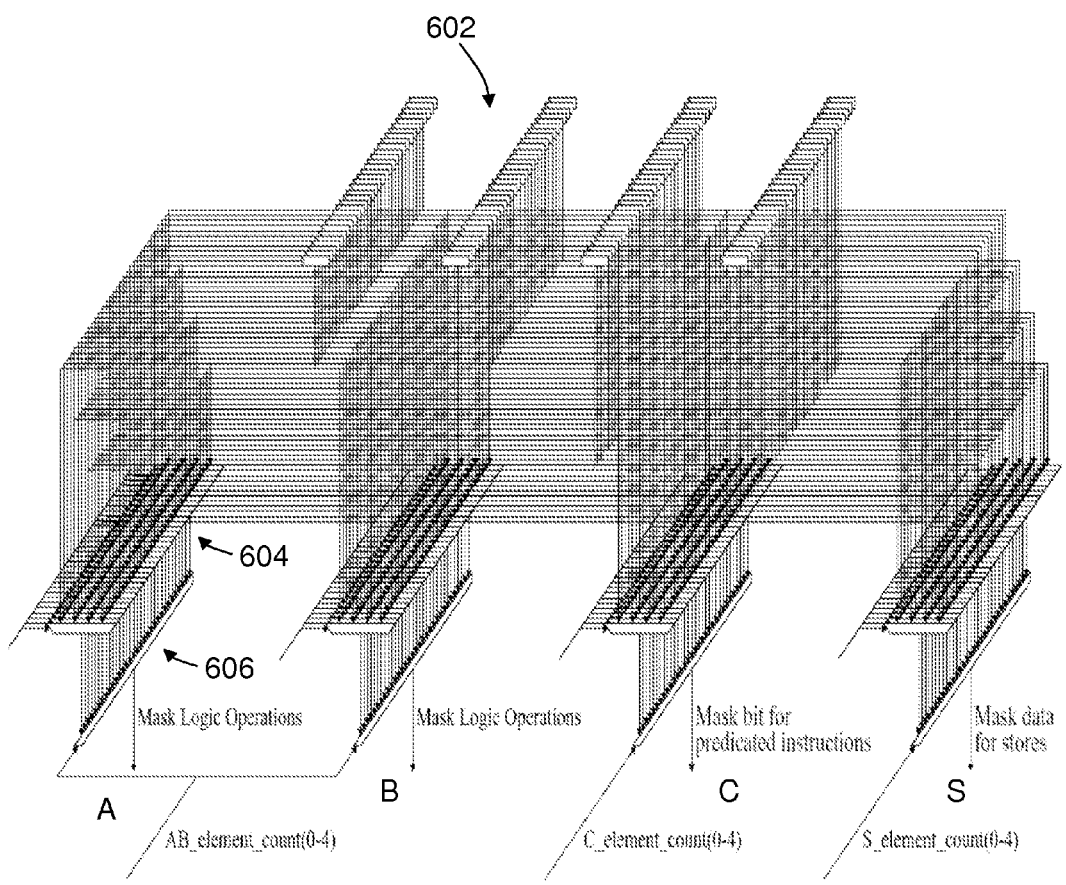
FIG. 6 illustrates an example of a vector mask register file in accordance with an embodiment.

FIG. 6 illustrates an example of VMR 424 of FIG. 4 in accordance with an embodiment. In the example of FIG. 6, VMR 424 includes 128 registers 602 arranged as 4 entries of 32 elements each. Each group of 4 registers 602 represents 4 entries that are routed to an entry selection multiplexer 604 per element per output port. Output ports A, B, C, and S provide outputs to support a number of operations using vector mask bits of the registers 602. Element selection multiplexers 606 allow for a selected entry and selected element combination to be routed to each of the output ports A, B, C, and S, where the final output for each port can be used for particular processing operations per processing slice. For example, output ports A and B can be used for mask logic operations, output port C can be used for mask bits for predicated instructions, and output port S can be used to mask data for stores.

Figure 7:
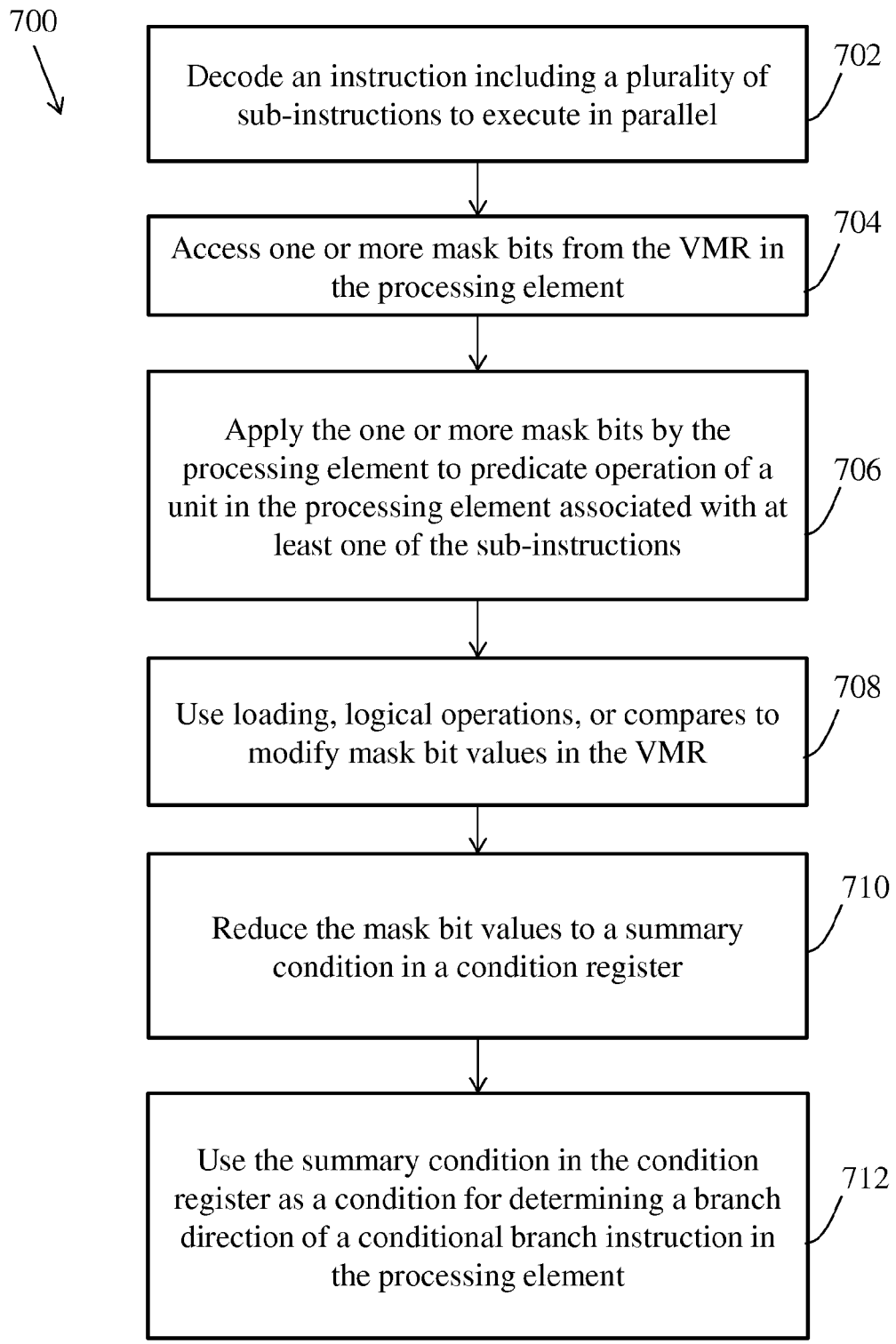
FIG. 7 illustrates a flow diagram of a process for predication in a vector processor in accordance with an embodiment.

FIG. 7 depicts an example process 700 for predication in a vector processor in an active memory device, such as the active memory devices of FIGS. 1-3. The blocks depicted in FIG. 7 may be performed by one of the processing elements of FIGS. 1-4 in an active memory device. For example, the blocks may be performed by a processing element in an active memory device, where the processing element accesses portions of memory (e.g., memory vaults sharing a stack with the processing element) and performs operations on data accessed from the memory. For purposes of explanation, the processing element is described in reference to processing element 400 of FIG. 4.

At block 702, processing element 400 decodes an instruction including a plurality of sub-instructions to execute in parallel. The instruction can be fetched from instruction buffer 406 and decoded by decoder 410. The instruction may be in a lane instruction format 500 to support parallel execution of ALU and LSU instructions. At block 704, one or more mask bits are accessed from VMR 424 in the processing element 400. At block 706, the one or more mask bits are applied by the processing element 400 to predicate operation of a unit in the processing element 400 associated with at least one of the sub-instructions. The one or more mask bits can be an instruction mask to block execution of one or more elements of the sub-instructions or execution of one or more execution slots operating on a sub-element of a sub-instruction. Mask bits of the VMR 424 can be used block a memory access sub-instruction of the LSU 420 or block part of an arithmetic operation of the ALU 418. The mask bits of the VMR 424 can also be used to perform clock or data gating at the VCR 414, SCR 416, ALU 418, and/or LSU 420.

At block 708, loading, logical operations, or compares can be used to populate and modify mask bit values in the VMR 424. For example, the mask bit values of the VMR 424 can be populated from one or more of the memory and the ALU 418. The processing element 400 can perform logical operations on the mask bit values to modify the mask bit values of the VMR 424. The VMR 424 can also be used for comparisons. For example, when the processing element 400 performs a compare of operands, using, for example the ALU 418, compare results may be stored as mask bit values to the VMR 424. The VMR 424 can include a plurality of vector mask entries, each including a plurality of elements of mask bits, forming two-dimensional vector masks in the VMR 424. Multiple mask bits may be generated per cycle per element based on single instruction, multiple data-in-space compare operations to form the two-dimensional vector masks in the VMR 424. The two-dimensional vector masks can be used with two-dimensional vector data, where the two-dimensional vector masks correspond to data sub-elements in the two-dimensional vector data to predicate.

At block 710, the mask bit values can be reduced to a summary condition, and the summary condition written to CR 426. The processing element 400 can determine whether the summary condition is an OR-reduction or an AND-reduction based on compare instruction syntax. Based on determining that the summary condition is the OR-reduction, the CR 426 is written as a logical OR combination of the compare results. Based on determining that the summary condition is the AND-reduction, the CR 426 is written as a logical AND combination of the compare results. The summary condition in the CR 426 can span multiple instructions. For example, the OR-reduction or the AND-reduction can also include a past value (or present value before update) of the CR 426 as part of the summary condition determination.

At block 712, the summary condition in the CR 426 can be used as a condition for determining a branch direction (e.g., take/don't take) of a conditional branch instruction in the processing element 400.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A system for vector processor predication in an active memory device, the system comprising:
   memory in the active memory device; and
   a processing element in the active memory device, the processing element comprising a vector mask register, an arithmetic logic unit, and a load store unit, the processing element configured to perform a method comprising:
      setting one or more mask bits in the vector mask register in the processing element;
      applying the one or more mask bits by the processing element to predicate operation of the arithmetic logic unit or the load-store unit in the processing element associated with at least one of a plurality of sub-instructions;
      performing a compare of operands in the processing element using predication of a compare instruction to perform less than a maximum supported number of comparisons in parallel based on the one or more mask bits;
      storing compare results of the compare instruction as mask bit values of the vector mask register;
      analyzing a compare instruction syntax bit of the compare instruction to select between performing an OR-reduction and an AND-reduction on the mask bit values stored in response to performing less than the maximum supported number of comparisons in parallel by the predication of the compare instruction;
      reducing the mask bit values to a summary condition by performing a logical OR combination of the compare results based on determining that the OR-reduction is selected by the compare instruction syntax bit;
      reducing the mask bit values to the summary condition by performing a logical AND combination of the compare results based on determining that the AND-reduction is selected by the compare instruction syntax bit;
      writing the summary condition to a condition register; and
      using the summary condition of the condition register to determine a branch direction of a conditional branch instruction in the processing element.

2. The system of claim 1, wherein applying the one or more mask bits by the processing element to predicate operation further comprises blocking one or more of: execution of at least one element of the sub-instructions and execution of at least one execution slot operating on a sub-element of at least one of the sub-instructions.

3. The system of claim 1, wherein applying the one or more mask bits by the processing element to predicate operation further comprises blocking one or more of: a memory access sub-instruction and part of an arithmetic operation.

4. The system of claim 1, wherein the processing element is further configured to perform:
   performing one or more of clock gating and data gating to one or more of: the arithmetic logic unit, the load-store unit, a vector computation register file, and a scalar computation register file based on the one or more mask bits.

5. The system of claim 1, wherein the processing element is further configured to perform:
   populating mask bit values of the vector mask register from one or more of: the memory and the arithmetic logic unit; and
   performing logical operations by the processing element on the mask bit values to modify the mask bit values of the vector mask register.

6. The system of claim 1, wherein performing the logical OR combination of the compare results further comprises including a current value of the condition register in the logical OR combination of the compare results, and performing the logical AND combination of the compare results further comprises including the current value of the condition register in the logical AND combination of the compare results.

7. A system for vector processor predication in an active memory device, the system comprising:
   memory in the active memory device, wherein the active memory device is a three-dimensional memory cube and the memory is divided into three-dimensional blocked regions as memory vaults; and
   a processing element in the active memory device, the processing element comprising a vector mask register, an arithmetic logic unit, and a load store unit, the processing element configured to perform a method comprising:
      fetching, in the processing element, an instruction from an instruction buffer in the processing element;
      decoding, in the processing element, the instruction comprising a plurality of sub-instructions to execute in parallel;
      setting one or more mask bits in the vector mask register in the processing element;
      applying the one or more mask bits by the processing element to predicate operation of the arithmetic logic unit or the load-store unit in the processing element associated with at least one of the sub-instructions;
      performing a compare of operands in the processing element using predication of a compare instruction to perform less than a maximum supported number of comparisons in parallel based on the one or more mask bits;
      storing compare results of the compare instruction as mask bit values of the vector mask register;
      analyzing a compare instruction syntax bit of the compare instruction to select between performing an OR-reduction and an AND-reduction on the mask bit values stored in response to performing less than the maximum supported number of comparisons in parallel by the predication of the compare instruction;
      reducing the mask bit values to a summary condition by performing a logical OR combination of the compare results based on determining that the OR-reduction is selected by the compare instruction syntax bit;
      reducing the mask bit values to the summary condition by performing a logical AND combination of the compare results based on determining that the AND-reduction is selected by the compare instruction syntax bit;

writing the summary condition to a condition register;
using the summary condition of the condition register to determine a branch direction of a conditional branch instruction in the processing element; and
accessing the memory through one or more memory controllers in the active memory device for data operated upon by the instruction.

8. The system of claim 7, wherein applying the one or more mask bits by the processing element to predicate operation further comprises blocking one or more of: execution of at least one element of the sub-instructions and execution of at least one execution slot operating on a sub-element of at least one of the sub-instructions.

9. The system of claim 7, wherein applying the one or more mask bits by the processing element to predicate operation further comprises blocking one or more of: a memory access sub-instruction to prevent an access of the memory, and part of an arithmetic operation.

10. The system of claim 7, wherein the vector mask register is comprised of a plurality of vector mask entries, each comprising a plurality of elements of the mask bits, forming two-dimensional vector masks in the vector mask register, and further comprising:
generating multiple mask bits per cycle per element based on single instruction, multiple data-in-space compare operations to form the two-dimensional vector masks in the vector mask register; and
using the two-dimensional vector masks with two-dimensional vector data, the two-dimensional vector masks corresponding to data sub-elements in the two-dimensional vector data to predicate.

11. The system of claim 7, wherein the processing element is further configured to perform:
performing one or more of clock gating and data gating to one or more of: the arithmetic logic unit, the load-store unit, a vector computation register file, and a scalar computation register file based on the one or more mask bits.

12. The system of claim 7, wherein the processing element is further configured to perform:
populating mask bit values of the vector mask register from one or more of: the memory and the arithmetic logic unit; and
performing logical operations by the processing element on the mask bit values to modify the mask bit values of the vector mask register.

13. The system of claim 7, wherein performing the logical OR combination of the compare results further comprises including a current value of the condition register in the logical OR combination of the compare results, and performing the logical AND combination of the compare results further comprises including the current value of the condition register in the logical AND combination of the compare results.

* * * * *